United States Patent
Cao et al.

(10) Patent No.: US 11,619,692 B2
(45) Date of Patent: Apr. 4, 2023

(54) METHOD FOR ACQUIRING AND PROCESSING MR DATA, MRI SYSTEM AND METHOD, AND STORAGE MEDIUM

(71) Applicant: GE Precision Healthcare, LLC., Wauwatosa, WI (US)

(72) Inventors: Nan Cao, Beijing (CN); Yongchuan Lai, Beijing (CN)

(73) Assignee: GE Precision Healthcare LLC, Wauwatosa, WI (US)

( * ) Notice: Subject to any disclaimer, the term of this patent is extended or adjusted under 35 U.S.C. 154(b) by 0 days.

(21) Appl. No.: 17/304,437

(22) Filed: Jun. 21, 2021

(65) Prior Publication Data

US 2021/0405140 A1 Dec. 30, 2021

(30) Foreign Application Priority Data

Jun. 24, 2020 (CN) .......................... 202010588766.1

(51) Int. Cl.
*G01R 33/48* (2006.01)
*G01R 33/561* (2006.01)
*G01R 33/56* (2006.01)

(52) U.S. Cl.
CPC ....... *G01R 33/4818* (2013.01); *G01R 33/561* (2013.01); *G01R 33/5608* (2013.01)

(58) Field of Classification Search
CPC .............. G01R 33/561; G01R 33/5608; G01R 33/4818
See application file for complete search history.

(56) References Cited

U.S. PATENT DOCUMENTS

| | | | |
|---|---|---|---|
| 5,497,088 A | 3/1996 | Hayano | |
| 8,228,060 B2 | 7/2012 | Busse | |
| 10,191,133 B2 | 1/2019 | Beck | |
| 2010/0134103 A1* | 6/2010 | Edelman | G01R 33/5635 324/309 |
| 2018/0210055 A1* | 7/2018 | Ding | G01R 33/565 |
| 2018/0348323 A1* | 12/2018 | Carinci | G01R 33/3852 |

\* cited by examiner

*Primary Examiner* — Gregory H Curran (57) ABSTRACT

Embodiments of the present invention provide a method for acquiring and processing magnetic resonance data, a magnetic resonance imaging system and method, and a computer-readable storage medium. The method for acquiring and processing magnetic resonance data comprises: populating, to a K-space, a plurality of sets of echo data acquired from a plurality of excitations of a tissue to be imaged, wherein at least two of the plurality of sets of echo data have opposite K-space populating orders; and reconstructing an image based on the echo data populated to the K-space.

18 Claims, 10 Drawing Sheets

METHOD FOR ACQUIRING AND PROCESSING MR DATA, MRI SYSTEM AND METHOD, AND STORAGE MEDIUM

CROSS-REFERENCE TO RELATED APPLICATIONS

This application claims priority pursuant to 35 U.S.C. 119(a) to China Patent Application No. 202010588766.1 filed on Jun. 24, 2020, the disclosure of which is herein incorporated by reference in its entirety.

TECHNICAL FIELD

Embodiments disclosed in the present invention relate to medical imaging technologies, and more specifically to a method for acquiring and processing magnetic resonance data, and a magnetic resonance imaging system and method.

BACKGROUND

Magnetic resonance imaging (MRI), as a medical imaging modality, can obtain images of the human body without using X-rays or other ionizing radiation. MRI utilizes a magnet having a strong magnetic field to generate a main magnetic field B0. When a part to be imaged in the human body is positioned in the main magnetic field B0, nuclear spins associated with hydrogen nuclei in human tissue are polarized, so that the tissue of the part to be imaged generates a longitudinal magnetization vector at a macroscopic level. After a radio-frequency field B1 intersecting the direction of the main magnetic field B0 is applied, the rotation direction of protons changes so that the tissue of the part to be imaged generates a transverse magnetization vector at a macroscopic level. After the radio-frequency field B1 is removed, the transverse magnetization vector decays in a spiral manner until it is restored to zero. A free induction decay signal is generated during decay. The free induction decay signal can be acquired as a magnetic resonance signal, and a tissue image of the part to be imaged can be reconstructed based on the acquired signal. A gradient system is configured to transmit a layer selection gradient pulse, a phase-coded gradient pulse, and a frequency-coded gradient pulse (also referred to as a read-out gradient pulse) to provide three-dimensional position information for the aforementioned magnetic resonance signal, thus implementing image reconstruction.

Based on different clinical applications, the magnetic resonance imaging system may be configured to perform imaging scans on human tissue according to different scan sequences. Typically, different scan sequences have their own characteristics in clinical applications, such as advantages and disadvantages. For example, some scan sequences that enable fast data acquisition are widely used in clinical applications because of the capability of fast imaging, but they also have image quality issues, e.g., image blurs that hinder medical observation.

SUMMARY

An embodiment of the present invention provides a method for acquiring and processing magnetic resonance data, the method comprising:
populating, to a K-space, a plurality of sets of echo data acquired from a plurality of excitations of a tissue to be imaged, wherein at least two of the plurality of sets of echo data have opposite K-space populating orders; and reconstructing an image based on the echo data populated to the K-space.

Optionally, every two adjacent sets of the plurality of sets of echo data have opposite K-space populating orders.

Optionally, each echo is populated to one phase encoding line of the K-space, and the opposite K-space populating orders comprise:
successive population from a first phase encoding line of the K-space to a second phase encoding line of the K-space; and successive population from the second phase encoding line of the K-space to the first phase encoding line of the K-space.

Optionally, the first phase encoding line is located at a first edge of the K-space or between the first edge and a center of the K-space, the second phase encoding line is located at a second edge of the K-space or between the second edge and the center of the K-space, and the first edge is opposite to the second edge.

Optionally, the first phase encoding line is located at the center of the K-space, the second phase encoding line is located at the first edge or the second edge of the K-space, and the first edge is opposite to the second edge.

Optionally, the method further comprises:
calculating average values of individual corresponding echoes in the plurality of sets of echo data populated to the K-space;
determining a central position echo based on the average values of the individual corresponding echoes, the central position echo being an echo corresponding to an effective time of echo; and
shifting echo positions of all of the sets of echo data populated to the K-space to move the central position echo to a center of the K-space.

Optionally, the determining the central position echo based on the average values of the individual corresponding echoes comprises:
determining a current configured time of echo;
determining an echo spacing time based on a pre-stored reference echo train;
calculating a reference echo ordinal position based on the current configured time of echo and the echo spacing time;
determining an echo located at the reference echo ordinal position in the reference echo train;
determining, from the average values of the individual corresponding echoes, an average value closest to the echo at the reference echo ordinal position; and
determining an echo associated with the closest average value as the central position echo.

Optionally, the reconstructing the image based on the echo data populated to the K-space comprises: reconstructing the image based on average values of the individual corresponding echoes in the sets of the shifted echo data in the K-space.

Optionally, a set of echo data acquired from each excitation of the tissue to be imaged comprises a plurality of echoes acquired based on a plurality of consecutive radio-frequency refocusing pulses.

Another embodiment of the present invention provides a magnetic resonance imaging method, comprising:
performing a first period of a scan sequence to obtain a first echo train comprising a plurality of first echoes;
populating, in a first order, the plurality of first echoes to a plurality of phase encoding lines of a K-space, respectively;
performing a second period of the scan sequence to obtain a second echo train comprising a plurality of second echoes; and populating, in a second order, the plurality of second echoes to the plurality of phase encoding lines, respectively, wherein the first order and the second order are opposite.

Optionally, the plurality of first echoes are generated in response to a plurality of radio-frequency refocusing pulses within the first period, and the plurality of second echoes are generated in response to a plurality of radio-frequency refocusing pulses within the second period.

Optionally, the scan sequence is a single-shot fast spin echo sequence.

Optionally, the first period and the second period are adjacent.

Optionally, in the first order, the plurality of first echoes in the first echo train are sequentially populated from a first phase encoding line of the K-space to a second phase encoding line of the K-space, and in the second order, the plurality of second echoes in the second echo train are sequentially populated from the second phase encoding line of the K-space to the first phase encoding line of the K-space.

Optionally, a center of the K-space is located on the first phase encoding line, on the second phase encoding line, or between the first phase encoding line and the second phase encoding line.

Another embodiment of the present invention provides a computer-readable storage medium for storing a computer program, where the computer program is used in a magnetic resonance imaging system to cause the magnetic resonance imaging system to perform the method according to any of the embodiments described above.

Another embodiment of the present invention provides a magnetic resonance imaging system, including:
a scanner;
a data acquisition unit; and
a controller configured to:
control the scanner to perform a first period and a second period of a scan sequence to obtain a first echo train comprising a plurality of first echoes and a second echo train comprising a plurality of second echoes; and
control the data acquisition unit to acquire the plurality of first echoes and the plurality of second echoes, sequentially populate, in a first order, the plurality of first echoes to a plurality of phase encoding lines of a K-space, and sequentially populate, in a second order, the plurality of second echoes to the plurality of phase encoding lines, the first order and the second order being opposite to each other.

It should be understood that the brief description above is provided to introduce in simplified form some concepts that will be further described in the Detailed Description of the Embodiments. The brief description above is not meant to identify key or essential features of the claimed subject matter. The protection scope is defined uniquely by the claims that follow the detailed description. Furthermore, the claimed subject matter is not limited to implementations that solve any disadvantages noted above or in any section of the present disclosure.

BRIEF DESCRIPTION OF THE DRAWINGS

The present invention will be better understood by reading the following description of non-limiting embodiments with reference to the accompanying drawings, where.

DETAILED DESCRIPTION OF THE EMBODIMENTS

Figure 1:
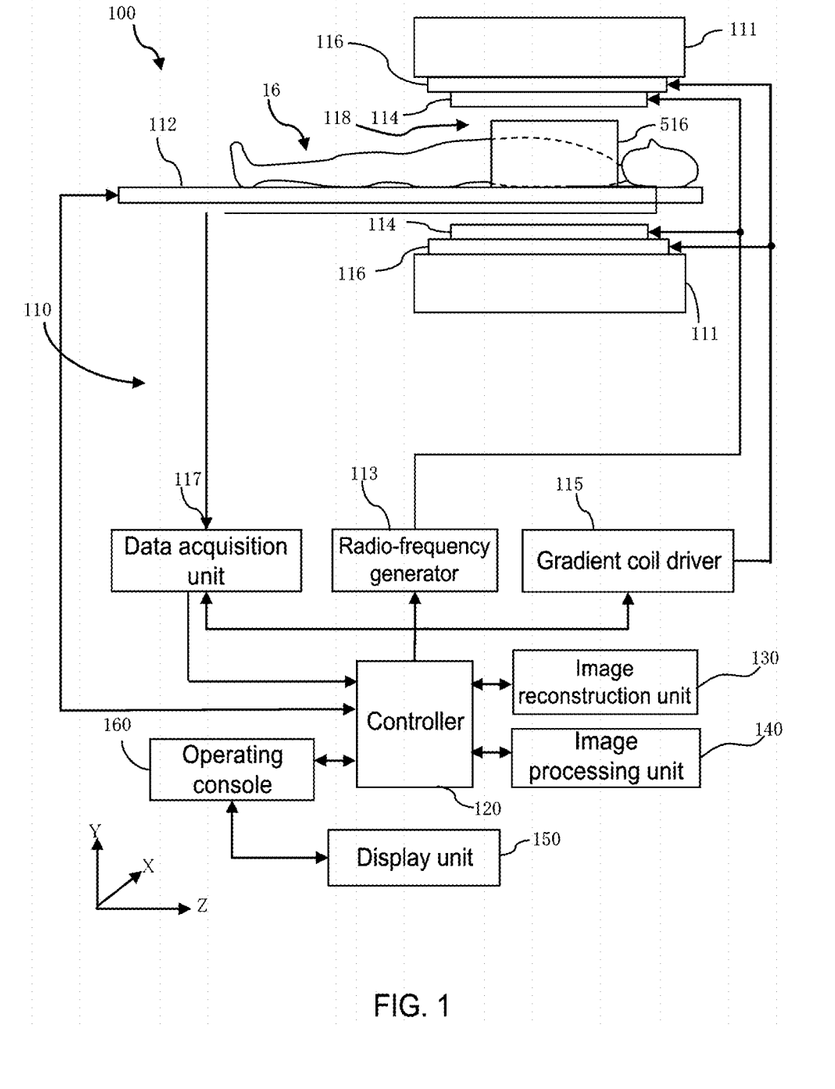
FIG. 1 is a schematic structural diagram of a magnetic resonance imaging system.

FIG. 1 is a schematic structural diagram of a magnetic resonance imaging (MM) system. The magnetic resonance imaging system 100 includes a scanner 110. The scanner 110 is configured to perform magnetic resonance scanning on an object (for example, a human body) 16 to produce image data of a region of interest of the object 16, and the region of interest may be a predetermined imaging part or tissue to be imaged. In one embodiment, the image data may include two-dimensional image data of a plurality of slices (or cross-sections) of a region of interest.

The magnetic resonance imaging system may include a controller 120, which is coupled to the scanner 110, for controlling the scanner 110 to perform the aforementioned magnetic resonance scanning process. Specifically, the controller 120 may send a sequence control signal to relevant components (such as a radio-frequency generator and a gradient coil driver that will be described below) of the scanner 110 through a sequence generator (not shown), so that the scanner 110 performs a preset scan sequence.

Those skilled in the art could understand that the "scan sequence" refers to a combination of pulses having specific amplitudes, widths, directions, and time sequences and applied when a magnetic resonance imaging scan is performed. The pulses may typically include, for example, a radio-frequency pulse and a gradient pulse. The radio-frequency pulse may include, for example, a radio-frequency transmit pulse, a radio-frequency refocusing pulse, etc., that are used to excite protons in the human body to resonate. The gradient pulse may include, for example, a layer selection gradient pulse, a phase encoding gradient pulse, a frequency encoding gradient pulse, etc. Typically, a plurality of scan sequences may be pre-configured in a magnetic resonance system, so that a sequence corresponding to clinical test requirements is selectable. The clinical test requirements may include, for example, a part to be imaged, an imaging function, an imaging effect, etc.

In practice, it may be required to select different scan sequence types based on different clinical applications, for example, an echo planar imaging (EPI) sequence, a gradient echo (GRE) sequence, a spin echo (SE) sequence, a fast spin echo (FSE) sequence, a single-shot fast spin echo (SSFSE), a diffusion weighted imaging (DWI) sequence, an inversion recovery (IR) sequence, etc. Each scan sequence may have different scan sequence parameters in different clinical applications, for example, the number of excitations (Nex), the time of echo, the echo train length, the repetition time, the inversion recovery time, etc.

The number of excitations refers to the number of excitations performed on the same tissue, and for example, may be the number of times that the radio-frequency transmit pulse is applied.

In an example, the scanner 110 may include a main magnet assembly 111, a table 112, a radio-frequency generator 113, a radio-frequency transmitting coil 114, a gradient coil driver 115, a gradient coil assembly 116, and a data acquisition unit 117.

The main magnet assembly 111 usually includes an annular superconducting magnet defined in a housing. The annular superconducting magnet is mounted in an annular vacuum container. The annular superconducting magnet and the housing thereof define a cylindrical space surrounding the object 16, for example, a scanning chamber 118 shown in FIG. 1. The main magnet assembly 111 generates a constant magnetic field, i.e., a B0 field, in a Z direction of the scanning chamber 118. Typically, a uniform portion of the B0 field is formed in a central region of the main magnet.

The table 112 is configured to carry the object 16, and travel in the Z direction to enter or exit the scanning chamber 118 in response to the control of the controller 120. For example, in an embodiment, an imaging volume of the object 16 may be positioned at a central region of the scanning chamber with uniform magnetic field strength so as to facilitate scanning imaging of the imaging volume of the object 16.

The Z direction is typically the direction extending from the head to the feet (or from the feet to the head) when the object 16 is positioned on the table 112. For example, a selected layer may be a slice at any position in the Z direction.

The magnetic resonance system transmits a static magnetic pulse signal to the object 16 located in the scanning chamber by using the formed B0 field, so that protons in a resonant volume within the body of the object 16 precess in an ordered manner to generate a longitudinal magnetization vector Mz.

The radio-frequency generator 113 is configured to generate a radio-frequency pulse, for example, a radio-frequency excitation pulse, in response to a control signal of the controller 120. The radio-frequency excitation pulse is amplified (for example, by a radio-frequency power amplifier (not shown)) and then applied to the radio-frequency transmitting coil 114, so that the radio-frequency transmitting coil 114 emits to the object 16 a radio-frequency field B1 orthogonal to the B0 field to excite nuclei in the aforementioned resonant volume, and generate a transverse magnetization vector Mxy.

The radio-frequency transmitting coil 114 may include, for example, a body coil disposed along an inner circumference of the main magnet, or a head coil dedicated to head imaging. The body coil may be connected to a transmitting/receiving (T/R) switch (not shown). The transmitting/receiving switch is controlled so that the body coil can be switched between a transmitting mode and a receiving mode. In the receiving mode, the body coil may be configured to receive a magnetic resonance signal from the object 16.

After the radio-frequency excitation pulse ends, the proton group becomes out-of-phase, the macroscopic transverse magnetization vector in the tissue gradually decays, a free induction decay signal, namely, a magnetic resonance signal that can be acquired, is generated during the process in which the transverse magnetization vector of the object 16 is gradually restored to zero. The magnetic resonance signal may be acquired in the form of "echoes," for example, spin echoes or gradient echoes, and which echo acquisition method is used may affect indicators such as the scanning time, imaging quality, etc.

Spin echoes typically use a radio-frequency refocusing pulse to refocus the phases of the proton group, and gradually increase the transverse magnetization vector, so that echoes can be acquired after the radio-frequency refocusing pulse ends. Scan sequences adopting the spin echo mode include, but are not limited to, SE, FSE, SSFSE, etc. Within one repetition time, the SE sequence applies one radio-frequency refocusing pulse after a radio-frequency transmit pulse, and acquires one echo, and each acquired echo is populated to one phase encoding line of a K-space in a sequential manner. Within one repetition time, the FSE sequence applies a plurality of radio-frequency refocusing pulses after a radio-frequency transmit pulse, and acquires a plurality of echoes, and the plurality of echoes are populated to a plurality of phase encoding lines of the K-space. Compared with the SE sequence, the number of required repetitions, i.e., the repetition time, is significantly reduced for the FSE sequence, thereby accelerating scanning. Within one repetition time, the SSFSE sequence acquires all echoes required for the K-space by utilizing consecutively applied radio-frequency refocusing pulses after the radio-frequency transmit pulse, and the echoes are then populated to all phase encoding lines of the K-space. Compared with the FSE sequence, the SSFSE only requires one radio-frequency excitation to acquire all echoes, thus having a shorter scan time. However, for both the FSE and SSFSE sequences, the signal amplitude is different for each echo due to the constant decay of the macroscopic transverse magnetization vector and the longer echo train, which will cause poor contrast in reconstructed images, and this problem is particularly pronounced for the SSFSE sequence.

The gradient coil driver 115 is configured to provide a suitable current/power to the gradient coil assembly 116 in response to a gradient pulse control signal or a shimming control signal sent by the controller 120.

The gradient coil assembly 116, on one hand, forms a varying magnetic field in an imaging space so as to provide three-dimensional position information to the magnetic resonance signal, and on the other hand, generates a compensating magnetic field of the B0 field to shim the B0 field.

The gradient coil assembly 116 may include three gradient coils. The three gradient coils are respectively configured to generate magnetic field gradients inclined to three spatial axes (for example, X-axis, Y-axis, and Z-axis) perpendicular to each other. More specifically, the gradient coil assembly 116 applies a magnetic field gradient in a slice selection direction (Z direction) so as to select a layer in the imaging volume. Those skilled in the art understand that the layer is any one of a plurality of two-dimensional slices distributed in the Z direction in the three-dimensional imaging volume. When the imaging is scanned, the radio-frequency transmitting coil 114 transmits a radio-frequency excitation pulse to the layer of the imaging volume and excites the layer. The gradient coil assembly 116 applies a magnetic field gradient in a phase encoding direction (Y direction) so as to perform phase encoding on a magnetic resonance signal of the excited layer. The gradient coil assembly 116 applies a gradient field in a frequency encoding direction of the object 16 so as to perform frequency encoding on the magnetic resonance signal of the excited layer.

The data acquisition unit 117 is configured to acquire the magnetic resonance signal (for example, received by the body coil or a surface coil) in response to a data acquisition control signal of the controller 120. In an embodiment, the data acquisition unit 117 may include, for example, a radio-frequency preamplifier, a phase detector, and an analog/digital converter, where the radio-frequency preamplifier is configured to amplify the magnetic resonance signal, the phase detector is configured to perform phase detection on the amplified magnetic resonance signal, and the analog/digital converter is configured to convert the phase-detected magnetic resonance signal from an analog signal to a digital signal.

The data acquisition unit 117 is further configured to store the digitized magnetic resonance signal (or echo) in the K-space in response to a data storage control signal of the controller 120. The K-space is a space to which raw data of magnetic resonance signals carrying spatial orientation encoding information is populated. Specifically, the data acquisition unit 117 populates, in response to a data storage control signal of the controller 120, the digitized magnetic resonance signals to the K-space in a specific manner.

The magnetic resonance imaging system 100 may include an image reconstruction unit 130, which is configured to perform an inverse Fourier transform on data stored in the K-space to reconstruct a three-dimensional image or a series of two-dimensional slice images of an imaging volume of the object 16. Specifically, the image reconstruction unit 130 may perform the image reconstruction described above based on communication with the controller 120.

The magnetic resonance imaging system 100 may include a processing unit 140, which may perform any required image processing on the three-dimensional image or any image in the image sequence, such as correcting an image and determining a display parameter of an image. The image processing described above may be an improvement or adaptive adjustment made to an image in any of contrast, uniformity, sharpness, brightness, etc. Specifically, the processing unit 140 may perform the image processing described above based on communication with the controller 120.

In one embodiment, the controller 120, the image reconstruction unit 130, and the processing unit 140 may separately or collectively include a computer and a storage medium, and the storage medium records a predetermined control program and data processing program executable by the computer. For example, a program configured to implement an imaging scan, image reconstruction, image processing, etc., may be stored on the storage medium. For example, a program configured to implement the method for storing magnetic resonance data or a magnetic resonance imaging method of the embodiments of the present invention may be stored on the storage medium. The storage medium may include, for example, a ROM, a floppy disk, a hard disk, an optical disk, a magneto-optical disk, a CD-ROM, or a non-volatile memory card.

The magnetic resonance imaging system 100 may include a display unit 150, which may be configured to display an operation interface and various data, images or parameters generated during a data acquisition or processing process.

The magnetic resonance imaging system 100 includes a console 160, which may include user input devices, such as a keyboard, a mouse, etc. The controller 120 may communicate with the scanner 110, the image reconstruction unit, the processing unit 140, the display unit 150, etc. in response to a control command generated by a user based on operating the console 160 or an operation panel/button, etc. disposed on a housing of a main magnet.

Figure 2:
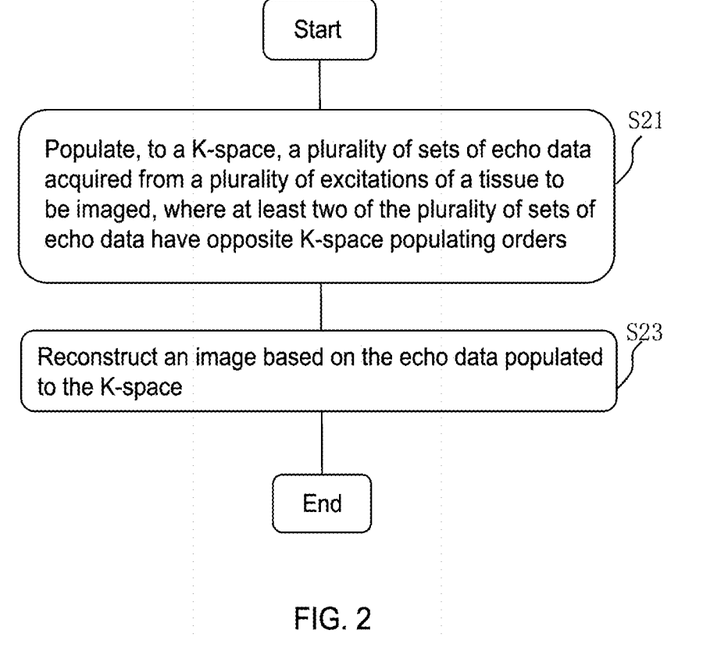
FIG. 2 shows a flowchart of a method for acquiring and processing magnetic resonance data according to an embodiment of the present invention.

FIG. 2 shows a flowchart of a method for acquiring and processing magnetic resonance (MR) data according to an embodiment of the present invention. As shown in FIG. 2, the method includes step S21 and step S23.

In step S21, a plurality of sets of echo data acquired from a plurality of excitations of a tissue to be imaged are populated to a K-space, where at least two of the plurality of sets of echo data have opposite K-space populating orders.

In step S23, an image is reconstructed based on the echo data populated to the K-space.

Specifically, "the plurality of excitations of the tissue to be imaged" refers to repeatedly acquiring magnetic resonance data of the same tissue to be imaged (for example, a layer of an imaging volume) multiple times, and may also refer to applying a radio-frequency transmit pulse to the same tissue to be imaged multiple times, and the number of times that the tissue to be imaged is excited is the number of excitations (NEX).

In each set of echo data, an earlier generated or acquired echo has a larger signal amplitude than a later generated or acquired echo. In other words, the signal amplitudes of echoes gradually decrease in the sequential order of echo generation or acquisition.

Optionally, every two adjacent sets of the plurality of sets of echo data have opposite K-space populating orders; that is, the echoes acquired from two adjacent excitations are populated to the K-space in opposite orders.

In one example, the opposite K-space populating orders above include: successive population from a first phase encoding line of the K-space to a second phase encoding line of the K-space, and successive population from the second phase encoding line to the first phase encoding line.

In an embodiment, the first phase encoding line may be located at a first edge of the K-space, and the second phase encoding line may be located at a second edge of the K-space. The first and second edges may be disposed opposite to each other on two sides of the center of the K-space, respectively, and the number of phase encoding lines between the first and second edges may be determined based on the image size. For example, for a 128*128 image, the K-space has at least 128 phase encoding lines. In certain applications, acquisition of 128 echoes is required to fill the at least 128 phase encoding lines, where the first and second phase encoding lines are respectively located at two edges, i.e., the first edge and the second edge, of the population space. Accordingly, a set of echo data is populated from the first edge to the second edge, and another set of echo data is populated from the second edge to the first edge.

In some other applications, only half of the echoes needs to be acquired to be populated to a half of the K-space, and data for the other half of the K-space is obtained based on mirroring the data populated to the half of the K-space, thereby obtaining data to be populated to the entire K-space. For example, for the 128*128 image, it is possible to only acquire echo trains having 64 echoes, and 64 echoes in one echo train are sequentially populated to the K-space from the center of the K-space to one edge, e.g., the second edge, and 64 echoes in another echo train are sequentially populated to the K-space from the second edge to the center of the K-space. In embodiments where such application is used, the first phase encoding line is located at the center of the K-space, and the second phase encoding line is located at the second edge of the K-space.

In applications where only half of the K-space needs to be populated, in order to facilitate subsequent image reconstruction, a small amount of additional multiple echoes are typically acquired to populate a portion of the phase encoding lines of the other half of the K-space. For example, for the 128*128 image, echo trains having 72 echoes may be acquired, where the first phase encoding line may be located between the first edge and the center of the K-space, 72 echoes in one echo train are sequentially populated to the K-space from the first phase encoding line located between the first edge and the center of the K-space to the second edge (passing through the center of the K-space), and 7 echoes in another echo train are sequentially populated to the K-space from the second edge to the first phase encoding line in a reverse direction (passing through the center of the K-space). In embodiments where such population technique is used, the first phase encoding line is located between the first edge and the center of the K-space, and the second phase encoding line is located at the second edge.

Figure 3:
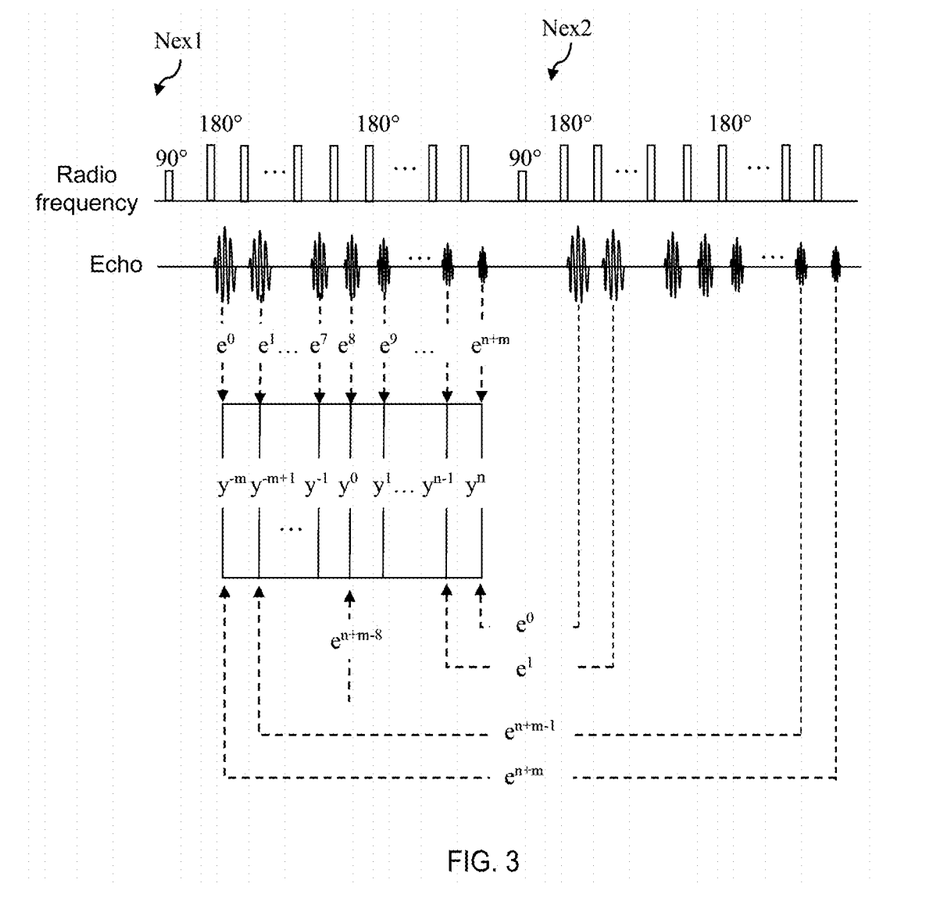
FIG. 3 shows a set of echo data acquired from each excitation of a tissue to be imaged, and also shows a scan sequence in which the tissue to be imaged is scanned and a plurality of echoes are generated.

FIG. 3 shows a schematic diagram of populating, to a K-space, a set of echo data, $e^0$, $e^1$, $e^2$, ..., $e^{n+m}$, acquired from each excitation of a tissue to be imaged. The K-space may include a plurality of phase encoding lines $y^{-m}$, $y^{-m+1}$, ..., $y^{-1}$, $y^0$, $y^1$, $y^2$, ..., $y_n$, where $y^0$ is located at the center of the K-space, $y^n$ is located at an edge of the K-space, for example, a second edge, and the K-space may further have a first edge corresponding to the second edge. The edge, first edge, or second edge above refers to the position to which the first or last echo is populated, and is not used to limit the storage capacity of the K-space itself, and n and m are both natural numbers. For example, n may be equal to 63 (corresponding to 64 phase encoding lines from $y^0$ to $y^{63}$), and m may be equal to 8 (for eight additionally acquired phase encoding lines $y^{-8}$ to $y^{-1}$. Those skilled in the art would understand that these phase encoding lines have sequentially stepped phase gradients.

As an example, in one excitation Next, a plurality of echoes $e^0$, $E^1$, $E^2$, ..., $E^{n+m}$ are successively populated to the K-space from a first phase encoding line (e.g., $y^{-m}$) of the K-space to a second phase encoding line (e.g., $y^n$) of the K-space, and in this case, the signal populated to the first phase encoding line has a larger signal amplitude, and there is a gradual decrease in signal amplitudes from the first phase encoding line to the second phase encoding line.

As an example, in another excitation Next, a plurality of echoes $e^0$, $E^1$, $E^2$, ..., $E^{n+m}$ are successively populated to the K-space from a second phase encoding line (e.g., $y^n$) of the K-space to a first phase encoding line (e.g., $y^{-m}$) of the K-space, and in this case, the signal populated to the second phase encoding line has a larger signal amplitude, and there is a gradual increase in signal amplitudes from the second phase encoding line to the first phase encoding line.

Further, if the tissue to be imaged is further repeatedly excited, and a corresponding plurality of sets of echo data are acquired, data may further be populated in an opposite direction with respect to a previous populating operation. For example, in another excitation Nex3, the plurality of sets of echoes are successively populated to the K-space from the first phase encoding line to the second phase encoding line of the K-space, and in this case, the signal populated to the first phase encoding line has a larger signal amplitude, and there is a gradual decrease in signal amplitudes from the first phase encoding line to the second phase encoding line.

FIG. 3 further shows a scan sequence in which the tissue to be imaged is scanned and a plurality of echoes $e^0$, $e^1$, $e^2$, ..., $e^{n+m}$ are generated, where each excitation of the tissue to be imaged is achieved by applying a single radio-frequency transmit pulse, a plurality of radio-frequency refocusing pulses are consecutively applied after the single radio-frequency transmit pulse to generate corresponding echoes, $e^0$, $e^1$, $e^2$, ..., $e^{n+m}$, and each echo is populated to one phase encoding line of the K-space when populating the K-space. In an example, the radio-frequency transmit pulse is a 90-degree radio-frequency pulse or a similarly angled one, and the radio-frequency refocusing pulse is a 180-degree radio-frequency pulse or a similarly angled one.

The aforementioned scan sequence is preferably an SSFSE sequence, where a plurality of radio-frequency refocusing pulses are consecutively applied after a single radio-frequency transmit pulse, and echoes acquired based on the plurality of radio-frequency refocusing pulses can then be populated to the entire K-space. The embodiments of the present invention are utilized to ensure both a sufficiently short imaging time and improved image sharpness, especially sharpness at an image edge portion, when using an SSFSE sequence to perform imaging.

In step S23, reconstructing the image based on the echo data populated to the K-space may include: reconstructing the image based on average values of the plurality of sets of echo data populated to the K-space. A plurality of echoes of the same tissue to be imaged are obtained by multiple repeated acquisitions of the same tissue, and an average signal amplitude of the plurality of echoes is acquired, thereby preventing data errors that result from image reconstruction based on only one set of echoes obtained from one excitation.

In addition, when population of the K-space is performed in an opposite order, various echoes at the same encoding line are configured to have diverse amplitudes. For example, in Next, the phase encoding lines $y^{-m}$ to $y^n$ present a gradual change in signal amplitudes from the maximum to the minimum, while in Nex2, the phase encoding lines $y^{-m}$ to $y^n$ present a gradual change in signal amplitudes from the minimum to the maximum, and so on, such that the average value of the signal amplitudes for each phase encoding line is closer to the average values of the signal amplitudes for the other phase encoding lines (less varied).

Figure 4:
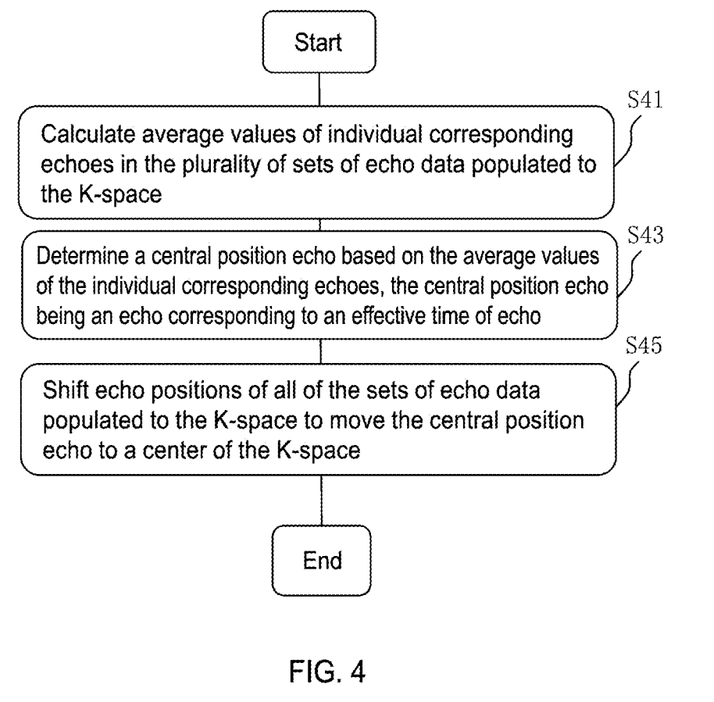
FIG. 4 shows a method for acquiring and processing magnetic resonance data provided in another embodiment of the present invention.

FIG. 4 shows a method for acquiring and processing magnetic resonance data provided in another embodiment of the present invention. As shown in FIG. 4, the method is similar to the method of the embodiment shown in FIG. 1, except that the method further includes steps S41, S43, and S45.

In step S41, average values of individual corresponding echoes in the plurality of sets of echo data populated to the K-space are calculated. In step S42, a central position echo is determined based on the average values of the individual corresponding echoes, with the central position echo being an echo corresponding to an effective time of echo. In step S45, echo positions of all of the sets of echo data populated to the K-space are shifted to move the central position echo to a center of the K-space.

Those skilled in the art would understand that a time of echo (TE), which refers to a time between the center of a radio-frequency transmit pulse and the center of an echo in the same period (or the same repetition time) of a scan sequence, may be automatically or manually configured during a magnetic resonance imaging scan. Therefore, based on the configured time of echo and an echo spacing (ESP) time, an ordinal position of the echo corresponding to the time of echo can be determined, and the echo at the ordinal position is typically populated to the center of the K-space in the existing techniques. For example, if the time of echo is 4 milliseconds (ms) and the echo spacing is 1 ms, the 4th echo in an echo train may be populated to the center of the K-space when populating the K-space, and the other echoes are populated in a sequential order.

However, if the opposite order in the embodiments of the invention is used to populate the K-space, the ordinal position determined by means of the existing techniques will no longer be suitable for populating the center of the K-space, and recalculation of an effective time of echo (TE) is required to improve the image sharpness without changing the contrast. In this embodiment, a reference echo train may be pre-stored in the magnetic resonance imaging system. The reference echo train is an echo train obtained from performing a scan, data acquisition, and population for a specific substance according to the existing techniques, and the specific substance has property characteristics identical or similar to those of the tissue to be imaged in the human body (for example, having the same or similar value of T2 (transverse relaxation time)). The echoes of this reference echo train have a fixed echo spacing (e.g., 1 ms).

Figure 5:
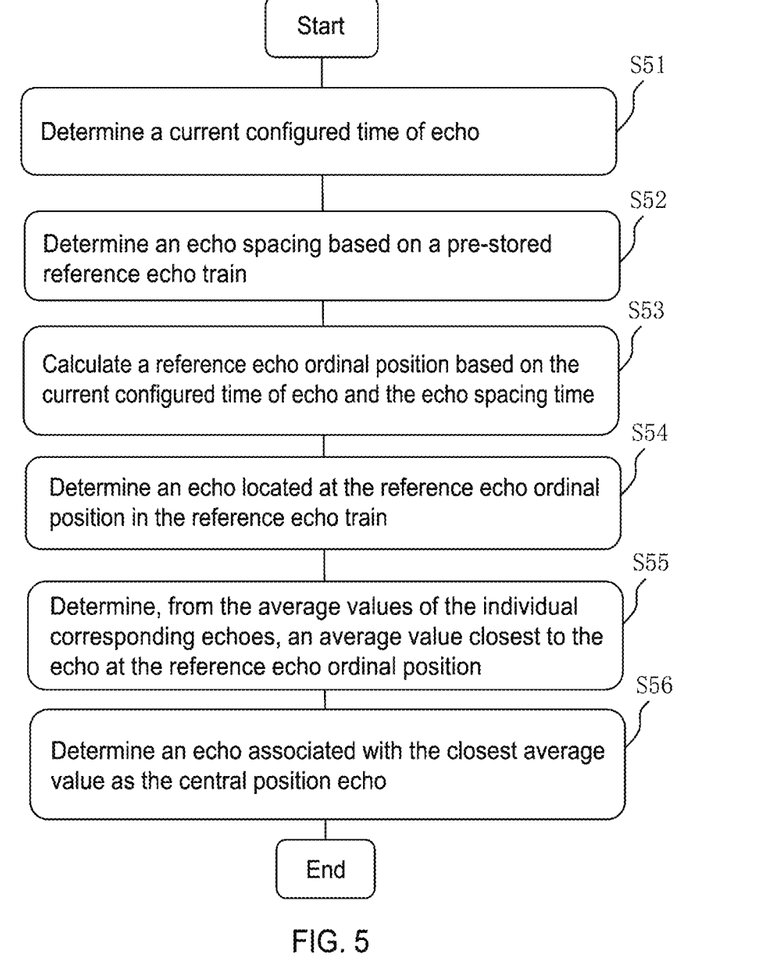
FIG. 5 is a flowchart for determining a central position echo based on average values of individual corresponding echoes.

FIG. 5 is a flowchart for determining a central position echo based on average values of individual corresponding echoes. As shown in FIG. 5, determining the central position echo based on the average values of the individual corresponding echoes in step S43 may specifically include the following steps:

step S51: determining a current configured time of echo (e.g., 4 ms);

step S52: determining an echo spacing time (e.g., 1 ms) based on a pre-stored reference echo train;

step S53: calculating a reference echo ordinal position based on the current configured time of echo and the echo spacing time, the reference echo ordinal position being an ordinal position of a certain echo in the reference echo train, where the reference echo ordinal position is, for example, determined by dividing the configured time of echo by the echo spacing, i.e., the 4th of all echoes in the reference echo train being the reference echo ordinal position;

step S54: determining an echo located at the reference echo ordinal position in the reference echo train, e.g., the 4th echo, which has a specific signal amplitude, e.g., 0.25;

step S55: determining, from the average values of the individual corresponding echoes, an average value closest to the echo at the reference echo ordinal position, e.g., determining, from the average value of the first echo to the average value of the last echo in the plurality of sets of echo data determined in step S41, one value closest to 0.25 (e.g., 0.251) as the closest average value (or an effective average value); and step S56: determining an echo associated with the closest average value as the central position echo.

For example, as shown in FIG. 3, in the current populating result, the 9th echo ($e^8$) is located at the center of the K-space, and if the result obtained in step S43 is that the average value of the sixth echo is 0.251, which is closest to 0.25, then in step S45, the position of each set of the echo data in the K-space is shifted, so that the sixth echo in each set of echo data is located on the phase encoding line y° at the center of the K-space. The "shifted" above means that the relative order of the echoes themselves is not changed.

Figure 6:
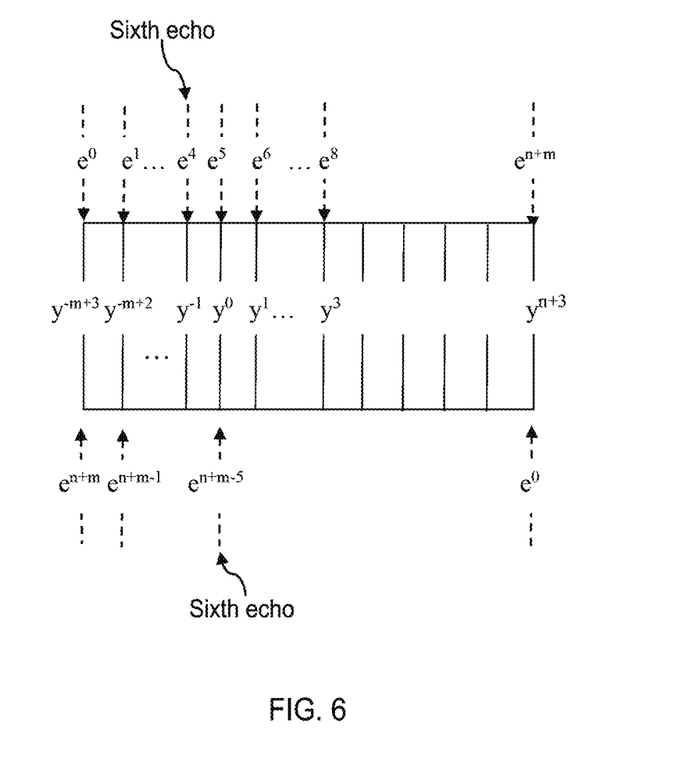
FIG. 6 shows a populating result after shifting two sets of echo data obtained from Nex1 and Nex2 in FIG. 3.

FIG. 6 shows a populating result after shifting two sets of echo data obtained from Nex1 and Nex2 in FIG. 3.

Therefore, in step S23, the image reconstruction may be performed based on the sets of shifted echo data in the K-space. Specifically, the image reconstruction may be performed based on the average values of the individual corresponding shifted echoes.

Figure 7:
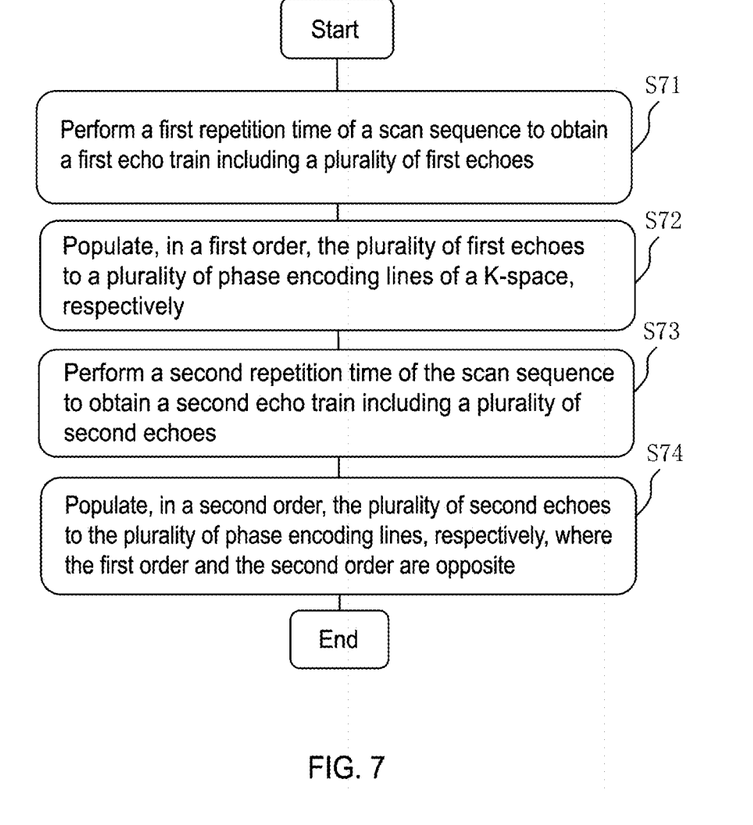
FIG. 7 is a flowchart of a magnetic resonance imaging method according to another embodiment of the present invention.

FIG. 7 is a flowchart of a magnetic resonance imaging (MM) method according to another embodiment of the present invention. As shown in FIG. 7, the method includes steps S71, S72, S73, and S74.

In step S71, a first period of a scan sequence is performed to obtain a first echo train including a plurality of first echoes. The scan sequence may be similar to the scan sequence shown in FIG. 3, and those skilled in the art would understand that one period of the scan sequence may be a duration from the start of one radio-frequency excitation to the end of a corresponding echo train, or a duration between the centers of two adjacent radio-frequency transmit pulses (i.e., a repetition time). When magnetic resonance data of the same tissue to be imaged needs to be repeatedly acquired N times, N (N being greater than 1) periods of the same scan sequence may be performed, where a radio-frequency transmit pulse and a plurality of radio-frequency refocusing pulses following the radio-frequency transmit pulse may be applied within each period. Each of the first echoes is generated based on the plurality of radio-frequency refocusing pulses within the first period. For example, one first echo that can be populated to one phase encoding line may be acquired after each radio-frequency refocusing pulse.

In step S72, the plurality of first echoes are respectively populated to a plurality of phase encoding lines of the K-space in a first order. For example, in the first order, the plurality of first echoes in the first echo train may be sequentially populated from a first phase encoding line of the K-space to a second phase encoding line of the K-space.

In step S73, a second period of the scan sequence is performed to obtain a second echo train including a plurality of second echoes. In this step, a radio-frequency transmit pulse and a plurality of radio-frequency refocusing pulses following the radio-frequency transmit pulse are applied within the second period, and the second echoes are generated based on the plurality of radio-frequency refocusing pulses within the second period.

In step S74, the plurality of second echoes are respectively populated to the plurality of phase encoding lines in a second order, wherein the first order and the second order are opposite. For example, in the second order, the plurality of second echoes in the second echo train may be sequentially populated from the second phase encoding line to the first phase encoding line.

As described above, the center of the K-space may be located on the first phase encoding line, on the second phase encoding line, or between the first and second phase encoding lines. Specific application examples may be similar to the corresponding descriptions above, which will not be further elaborated herein.

The scan sequence is preferably an SSFSE sequence, and optionally, may also be an FSE sequence. Even though the K-space cannot be completely populated after one excitation in the FSE sequence, as long as echoes on a plurality of phase encoding lines are acquired repeatedly multiple times, the image sharpness can be enhanced by populating echoes acquired from two adjacent acquisitions in opposite orders.

In one embodiment, the first period and the second period are adjacent. If a plurality of periods of a scan sequence are performed for the same tissue to be imaged, the orders of populating echoes acquired within every two adjacent periods to the K-space can be configured to be opposite.

In other embodiments, the first period and the second period may be nonadjacent. For example, in an embodiment, there are four periods, and the K-space populating order may be the same for echoes acquired within the first two periods, while the K space populating order for echoes acquired within the next two periods is opposite to the order for the previous two populating operations.

In yet another example, there are five periods, and as long as image sharpness can be achieved, only one of the periods need to be configured with a K-space populating order opposite to K-space populating orders of the other periods for the acquired echoes.

Based on the above description, an embodiment of the present invention may further provide a magnetic resonance imaging system, including a scanner, a data acquisition unit, and a controller. The structure and working principle of the magnetic resonance imaging system of this embodiment may be similar to the system shown in FIG. 1, and the difference lies in that the controller is configured to control the scanner and the data acquisition unit to implement the magnetic resonance imaging method described above in the embodiment. For example, the controller is configured to: control the scanner to perform a first period and a second period of a scan sequence to obtain a first echo train including a plurality of first echoes and a second echo train including a plurality of second echoes; and
control the data acquisition unit to acquire the plurality of first echoes and the plurality of second echoes, sequentially populate, in a first order, the plurality of first echoes to a plurality of phase encoding lines of a K-space, and sequentially populate, in a second order, the plurality of second echoes to the plurality of phase encoding lines, where the first order and the second order are opposite.

Based on the above description, an embodiment of the present invention may further provide a computer-readable storage medium for storing a computer program, where the computer program is used in a magnetic resonance imaging system to control the magnetic resonance imaging system to implement the method for acquiring and processing magnetic resonance data and the magnetic resonance image method in any one of the above embodiments.

Figure 8:
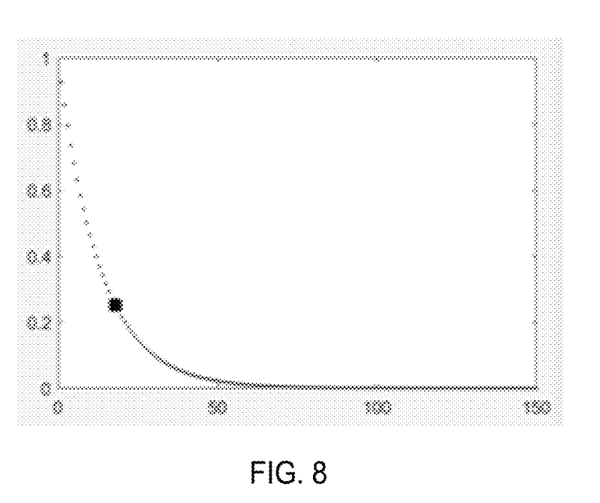
FIG. 8 shows a plot of the change in amplitudes of signals distributed in a K-space obtained by acquiring magnetic resonance data using an existing technique.
Figure 9:
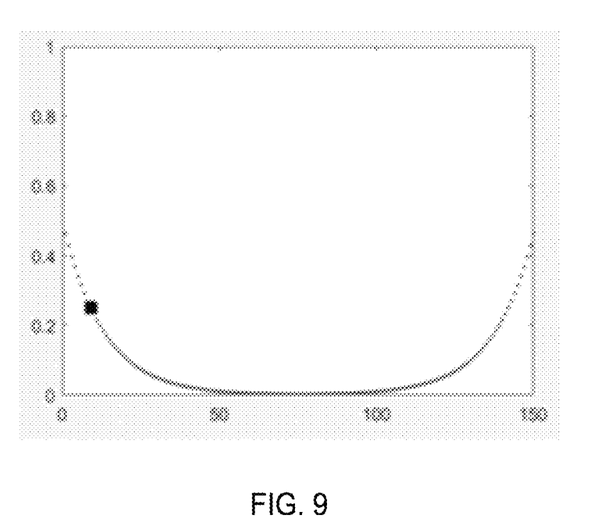
FIG. 9 is a point spread function diagram obtained by performing an inverse Fourier transform on the signals in FIG. 8.
Figure 10:
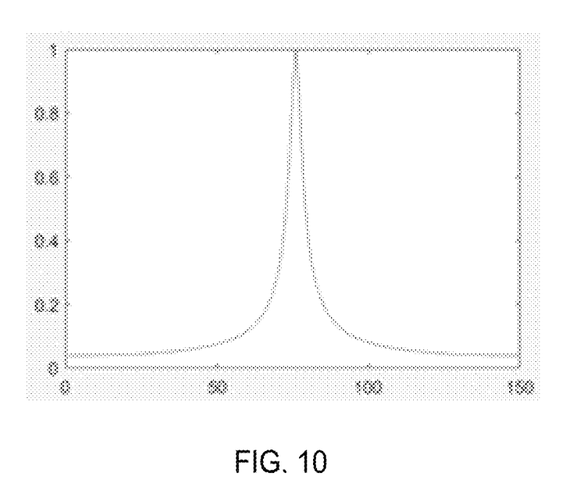
FIG. 10 shows a plot of the change in amplitudes of signals distributed in a K-space obtained by using an embodiment of the present invention.
Figure 11:
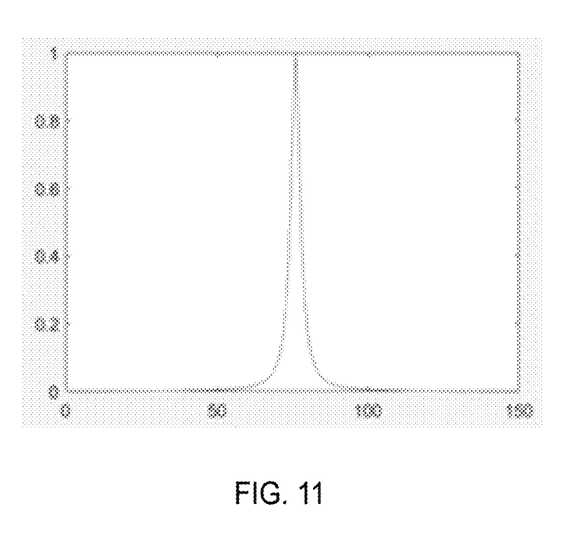
FIG. 11 is a point spread function diagram obtained by performing an inverse Fourier transform on the signals in FIG. 10.

FIG. 8 shows a plot of the change in amplitudes of signals distributed in a K-space obtained by acquiring magnetic resonance data using an existing technique, and FIG. 9 is a point spread function diagram obtained by performing an inverse Fourier transform on the signals in FIG. 7. FIG. 10 shows a plot of the change in amplitudes of signals distributed in a K-space obtained by using an embodiment of the present invention, and FIG. 11 is a point spread function diagram obtained by performing an inverse Fourier transform on the signals in FIG. 10. In FIG. 8, the signal amplitudes in a region close to the center of the K-space and a region close to an edge have a large difference, while FIG. 10 has a small signal amplitude difference, which facilitates reconstruction of a clearer image, and reduces the blur problem likely to occur at an image edge. The signal distribution in FIG. 9 is wider, while the signal distribution in FIG. 11 is more concentrated, which reflects that the image reconstructed by using the embodiment of the present invention has a better spatial resolution.

Figure 12:
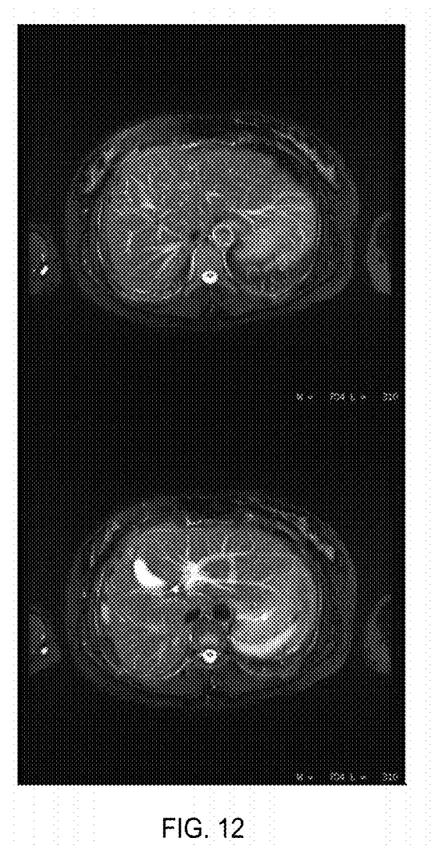
FIG. 12 shows images obtained by using an existing data acquisition technique.
Figure 13:
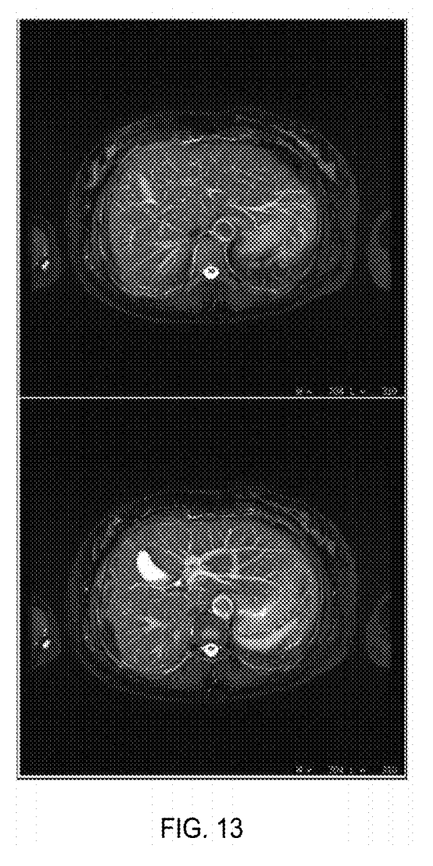
FIG. 13 shows images obtained by using a data acquisition technique according to an embodiment of the present invention.

FIG. 12 shows images obtained by using an existing data acquisition technique, and FIG. 13 shows images obtained by using a data acquisition technique according to an embodiment of the present invention. The images shown in FIG. 13 have higher sharpness.

As used herein, an element or step described as singular and preceded by the word "a" or "an" should be understood as not excluding such element or step being plural, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising," "including," or "having" an element or a plurality of elements having a particular property may include additional elements that do not have such property. The terms "including" and "in which" are used as the plain-language equivalents of the respective terms "comprising" and "wherein". Furthermore, in the appended claims, the terms "first", "second," "third" and so on are used merely as labels, and are not intended to impose numerical requirements or a particular positional order on their objects.

This written description uses examples to disclose the present invention, including the best mode, and also to enable those of ordinary skill in the relevant art to implement the present invention, including making and using any devices or systems and performing any incorporated methods. The patentable scope of the present invention is defined by the claims, and may include other examples that occur to those skilled in the art. Such other examples are intended to be within the scope of the claims if they have structural elements that do not differ from the literal language of the claims, or if they include equivalent structural elements without substantial differences from the literal language of the claims.

The invention claimed is:

1. A method for acquiring and processing magnetic resonance data, the method comprising:
  populating, to a K-space, a plurality of sets of echo data acquired from a plurality of excitations of a tissue to be imaged, wherein at least two of the plurality of sets of echo data have opposite K-space populating orders;
  reconstructing an image based on the echo data populated to the K-space;
  calculating average values of individual corresponding echoes in the plurality of sets of echo data populated to the K-space;
  determining a central position echo based on the average values of the individual corresponding echoes, the central position echo being an echo corresponding to an effective time of echo; and
  shifting echo positions of all of the sets of echo data populated to the K-space to move the central position echo to a center of the K-space.

2. The method according to claim 1, wherein every two adjacent sets of the plurality of sets of echo data have opposite K-space populating orders.

3. The method according to claim 1, wherein each echo is populated to one phase encoding line of the K-space, and the opposite K-space populating orders comprise:
  successive population from a first phase encoding line of the K-space to a second phase encoding line of the K-space; and
  successive population from the second phase encoding line of the K-space to the first phase encoding line of the K-space.

4. The method according to claim 3, wherein
  the first phase encoding line is located at a first edge of the K-space or between the first edge and a center of the K-space, the second phase encoding line is located at a second edge of the K-space or between the second edge and the center of the K-space, and the first edge is opposite to the second edge.

5. The method according to claim 3, wherein
the first phase encoding line is located at a center of the K-space, the second phase encoding line is located at a first edge or a second edge of the K-space, and the first edge is opposite to the second edge.

6. The method according to claim 1, wherein the determining the central position echo based on the average values of the individual corresponding echoes comprises:
determining a current configured time of echo;
determining an echo spacing time based on a pre-stored reference echo train;
calculating a reference echo ordinal position based on the current configured time of echo and the echo spacing time;
determining an echo located at the reference echo ordinal position in the reference echo train;
determining, from the average values of the individual corresponding echoes, an average value closest to the echo at the reference echo ordinal position; and
determining an echo associated with the closest average value as the central position echo.

7. The method according to claim 1, wherein the reconstructing the image based on the echo data populated to the K-space comprises: reconstructing the image based on average values of the individual corresponding echoes in the sets of the shifted echo data in the K-space.

8. The method according to claim 1, wherein a set of echo data acquired from each excitation of the tissue to be imaged comprises a plurality of echoes acquired based on a plurality of consecutive radio-frequency refocusing pulses.

9. A magnetic resonance imaging method, comprising:
performing a first period of a scan sequence to obtain a first echo train comprising a plurality of first echoes;
populating, in a first order, the plurality of first echoes to a plurality of phase encoding lines of a K-space, respectively;
performing a second period of the scan sequence to obtain a second echo train comprising a plurality of second echoes;
populating, in a second order, the plurality of second echoes to the plurality of phase encoding lines, respectively,
wherein the first order and the second order are opposite;
calculating average values of individual corresponding echoes in the plurality of first and second echoes;
determining a central position echo based on the average values of the individual corresponding echoes, the central position echo being an echo corresponding to an effective time of echo; and
shifting echo positions of the plurality of first and second echoes to move the central position echo to a center of the K-space.

10. The method according to claim 9, wherein the scan sequence is a single-shot fast spin echo sequence.

11. The method according to claim 9, wherein the first period and the second period are adjacent.

12. The method according to claim 9, wherein
in the first order, the plurality of first echoes in the first echo train are sequentially populated from a first phase encoding line of the K-space to a second phase encoding line of the K-space, and
in the second order, the plurality of second echoes in the second echo train are sequentially populated from the second phase encoding line of the K-space to the first phase encoding line of the K-space.

13. The method according to claim 12, wherein a center of the K-space is located on the first phase encoding line, on the second phase encoding line, or between the first phase encoding line and the second phase encoding line.

14. A non-transitory computer-readable storage medium for storing a computer program, wherein the computer program is used in a magnetic resonance imaging system to cause the magnetic resonance imaging system to implement the method according to claim 1.

15. A magnetic resonance imaging system, comprising:
a scanner;
a data acquisition unit; and
a controller configured to:
control the scanner to perform a first period and a second period of a scan sequence to respectively obtain a first echo train comprising a plurality of first echoes and a second echo train comprising a plurality of second echoes;
control the data acquisition unit to acquire the plurality of first echoes and the plurality of second echoes, sequentially populate, in a first order, the plurality of first echoes to a plurality of phase encoding lines of a K-space, and sequentially populate, in a second order, the plurality of second echoes to the plurality of phase encoding lines, the first order and the second order being opposite to each other;
wherein the controller is further configured to control the data acquisition unit to:
calculate average values of individual corresponding echoes in the plurality of first and second echoes;
determine a central position echo based on the average values of the individual corresponding echoes, the central position echo being an echo corresponding to an effective time of echo; and
shift echo positions of the plurality of first and second echoes to move the central position echo to a center of the K-space.

16. The system according to claim 15, wherein
in the first order, the plurality of first echoes are sequentially populated from a first phase encoding line of the K-space to a second phase encoding line of the K-space, and
in the second order, the plurality of second echoes are sequentially populated from the second phase encoding line to the first phase encoding line.

17. The system according to claim 16, wherein a center of the K-space is located on the first phase encoding line, on the second phase encoding line, or between the first phase encoding line and the second phase encoding line.

18. A method for acquiring and processing magnetic resonance data, the method comprising:
populating, to a K-space, a plurality of sets of echo data acquired from a plurality of excitations of a tissue to be imaged, wherein at least two of the plurality of sets of echo data have opposite K-space populating orders;
reconstructing an image based on the echo data populated to the K-space;
calculating average values of individual corresponding echoes in the plurality of sets of echo data populated to the K-space;
determining a central position echo based on the average values of the individual corresponding echoes, the central position echo being an echo corresponding to an effective time of echo;

shifting echo positions of all of the sets of echo data populated to the K-space to move the central position echo to a center of the K-space; and wherein a set of echo data acquired from each excitation of the tissue to be imaged comprises a plurality of echoes acquired based on a plurality of consecutive radio-frequency refocusing pulses.

\* \* \* \* \*